United States Patent [19]

Rokugo et al.

[11] Patent Number: 5,604,774
[45] Date of Patent: Feb. 18, 1997

[54] FULLY SECONDARY DPLL AND DESTUFFING CIRCUIT EMPLOYING SAME

[75] Inventors: Yoshinori Rokugo; Masaaki Itoh, both of Tokyo, Japan

[73] Assignee: NEC Corporation, Tokyo, Japan

[21] Appl. No.: 527,353

[22] Filed: Sep. 12, 1995

[30] Foreign Application Priority Data

Sep. 12, 1994 [JP] Japan .................................. 6-217438

[51] Int. Cl.[6] ...................................................... H03D 3/24
[52] U.S. Cl. ......................... 375/376; 327/147; 327/156; 331/10; 331/18
[58] Field of Search ..................................... 375/371, 373, 375/376, 377; 327/141, 145, 147, 151, 156, 155, 159; 331/1 A, 1 R, 17, 18, 25, 10

[56] References Cited

U.S. PATENT DOCUMENTS

| | | | |
|---|---|---|---|
| 4,791,386 | 12/1988 | Shiga | 331/1 A |
| 4,827,225 | 5/1989 | Lee | 331/10 |
| 5,349,309 | 9/1994 | Fujii | 331/17 |
| 5,399,985 | 3/1995 | Awata et al. | 327/159 |

OTHER PUBLICATIONS

Rokugo et al; "A Digital Phase–Locked Loop for Stuffing Synchronization Systems"; *Electronics and Communications in Japan*, vol. 75, No. 4, Part 1, Apr. 1992, pp. 1–12.

Nakajima et al; "Performance Improvement of DPLL with Adaptive Binary Quantized Phrase–Frequency Converter"; *Electronics and Communications in Japan*, vol. 73, No. 8, Part 1, Aug. 1990, pp. 56–65.

Hikawa et al; "All Digital Phase–Locked Loop with a Wide Locking Range"; *Electronics and Communications in Japan*, vol. 70, No. 7, Part 1, Jul. 1987.

*Primary Examiner*—Stephen Chin
*Assistant Examiner*—Thuy L. Nguyen
*Attorney, Agent, or Firm*—Foley & Lardner

[57] ABSTRACT

Each of primary and secondary random-walk filters has longer and shorter time constants. A multi-valued phase comparator generates a start signal if a phase error generated when an abrupt frequency change occurs exceeds a given value. In response to the start signal, the primary and secondary random-walk filters are set to the shorter time constants. A timer is started by the start signal, and upon elapse of a predetermined period of time, sets the primary and secondary random-walk filters to the longer time constants.

4 Claims, 2 Drawing Sheets

FULLY SECONDARY DPLL AND DESTUFFING CIRCUIT EMPLOYING SAME

BACKGROUND OF THE INVENTION

1. Field of the Invention

The present invention relates to a digital phase-locked loop (DPLL) for use in stuffing synchronization, and more particularly to a fully secondary DPLL for use in a synchronous digital hierarchy (SDH).

2. Description of the Prior Art

SDH employs pointer operation which uses byte stuffing, and generates eight [UI/time] phase gaps in one control period. PLLs for use in SDH are required to have a very narrow frequency band in order to suppress phase gaps that are generated by pointer operation, i.e., insertion and removal of stuffing pulses.

A Bit-Leaking method is known as a scheme for achieving a PLL having a very narrow frequency band. According to the Bit-Leaking method, eight [UI/time] phase gaps generated by pointer operation are divided into 1 [UI] units and scattered (bit-leaked) at certain time intervals for thereby reducing jitter amplitudes. The Bit-Leaking method is a digital version of the phase-locked loop (PLL) that has traditionally been used in the art. FIG. 1 of the accompanying drawing shows the Bit-Leaking method.

As shown in FIG. 1, an input signal 20 and an output signal 30 are compared in phase with each other by a phase comparator 40, which applies an output signal to a low-pass filter 50. The low-pass filter 50 smoothes the output signal from the phase comparator 40, and supplies an output signal to a variable-control oscillator 60, which produces an output signal 30 depending on the output signal from the low-pass filter 50. According to a Fixed Bit-Leaking scheme, the phase comparator 40 has positive and negative thresholds, and the phase gaps are bit-leaked at fixed periods if the phase error or difference between write and read clock signals exceeds the thresholds. According to an Adaptive Bit-Leaking scheme, the phase gaps are bit-leaked depending on a phase error that is detected by the phase comparator 40.

The Fixed Bit-Leaking scheme is disadvantageous in that control is not uniform, posing limitations on the suppression of jitter, because the control period is constant regardless of the number of times the pointer is controlled per second, and hence control pulses are concentrated in the constant period. In the Adaptive Bit-Leaking scheme, to uniformize control quantities in the time domain, a steady phase error corresponding to the amount by which the pointer is controlled is generated for controlling the variable-control oscillator. Therefore, a buffer memory provided at the former stage of the PLL needs to be large enough to absorb the steady phase error that is generated. In addition, since it is necessary to increase the time constant of the system for keeping a strong jitter suppression capability, the period of time that is consumed to bring the system into operation is long in proportion to the amount by which the pointer is controlled.

SUMMARY OF THE INVENTION

It is an object of the present invention to provide a fully secondary DPLL which minimizes the size of the buffer memory for eliminating steady phase error, and a destuffing circuit which employs such a fully secondary DPLL.

To achieve the above object, there is provided in accordance with the present invention a fully secondary digital phase-locked loop comprising:

a primary loop including frequency regulating means for regulating a reference frequency $Rf_R$ by adding or removing pulses, divide-by-R frequency dividing means for dividing a regulated frequency from the frequency regulating means by R to produce an output frequency $f_{out}$, first and second divide-by-N frequency dividing means for dividing an input frequency $f_{in}$ and said output frequency fout by N, multi-valued phase comparing means for comparing output signals from said first and second divide-by-N frequency dividing means in phase with each other, a primary random-walk filter having longer and shorter time constants, for dividing, by N1, the difference between the numbers of leading and lagging pulses outputted from the multi-valued phase comparing means, and adder/subtracting means for producing control pulses to be supplied to the frequency regulating means;

a secondary loop including a secondary random-walk filter having longer and shorter time constants, for dividing, by N2, an output signal from the primary random-walk filter, a modulo-Q counter for storing an output signal from the secondary random-walk filter, a rate multiplier energizable by the output frequency $f_{out}$ and controllable by the output signal stored by the modulo-Q counter, for generating additional or removable pulses corresponding to a central system frequency, and the adding/subtracting means for adding and subtracting output signals from the primary random-walk filter and the rate multiplier to produce control pulses to be supplied to the frequency regulating means;

phase comparing means for generating a start signal if a phase error generated when an abrupt frequency change occurs exceeds a given value; and timer means for setting the primary random-walk filter and the secondary random-walk filter to the shorter time constants in response to the start signal, and setting the primary random-walk filter and the secondary random-walk filter to the longer time constants after elapse of a predetermined period of time.

According to the present invention, there is also provided a destuffing circuit comprising:

a primary loop including frequency regulating means for-regulating a reference frequency $Rf_R$ by adding or removing pulses, divide-by-R frequency dividing means for dividing a regulated frequency from the frequency regulating means by R to produce an output frequency $f_{out}$, first and second divide-by-N frequency dividing means for dividing an input frequency $f_{in}$ and the output frequency $f_{out}$ by N, multi-valued phase comparing means for comparing output signals from the first and second divide-by-N frequency dividing means in phase with each other, a primary random-walk filter having longer and shorter time constants, for dividing, by N1, the difference between the numbers of leading and lagging pulses outputted from the multi-valued phase comparing means, and adder/subtracting means for producing control pulses to be supplied to the frequency regulating means;

a secondary loop including a secondary random-walk filter having longer and shorter time constants, for dividing, by N2, an output signal from the primary random-walk filter, a modulo-Q counter for storing an output signal from the secondary random-walk filter, a rate multiplier energizable by the output frequency fout and controllable by the output signal stored by the modulo-Q counter, for generating additional or removable pulses corresponding to a central system frequency, and the adding/subtracting means for adding and subtracting output signals from the primary random-walk filter and the rate multiplier to produce control pulses to be supplied to the frequency regulating means;

phase comparing means for generating a start signal if a phase error generated when an abrupt frequency change occurs exceeds a given value; and timer means for setting the primary random-walk filter and the secondary random-walk filter to the shorter time constants in response to the start signal, and setting the primary random-walk filter and the secondary random-walk filter to the longer time constants after elapse of a predetermined period of time.

The principles of the present invention are based on the positive utilization of the function of the fully secondary DPLL to store a central system frequency, and rely on the fact that no steady phase error is produced as long as the DPLL operates on the stored central system frequency. Specifically, a steady phase error is generated to lock a PLL on an input frequency if the input frequency differs from a reference output frequency of the PLL. In the fully secondary DPLL, the steady phase error provides control information for the primary loop. Insofar as the fully secondary DPLL stores the input frequency, i.e., the central system frequency, no steady phase error required for the control of the primary loop is generated because control pulses are produced by the secondary loop.

If an abrupt frequency shift occurs, then a large phase error is produced. When the phase error is detected as exceeding a predetermined value by the phase comparator, then the time constants of the primary and secondary loops are switched to shorter ones, and the timer is simultaneously started and the fully secondary DPLL is locked on the frequency. After elapse of a predetermined period of time as measured by the timer, the primary and secondary loops are set to the longer time constants again.

Under steady conditions, since the fully secondary DPLL operates based on the central system frequency stored by the secondary loop, no steady phase error is produced, and any memory space that has heretofore been assigned to a buffer memory for storing a steady phase error is no longer necessary. When an abrupt frequency shift occurs, the fully secondary DPLL is locked on the frequency in a short period of time because the primary and secondary loops are set to the shorter time constants. After the fully secondary DPLL is locked on the frequency, the primary and secondary loops are set to the longer time constants again. Therefore, the fully secondary DPLL has a very narrow frequency band.

The above and other objects, features, and advantages of the present invention will become apparent from the following description by referring to the accompanying drawings which illustrate an example of the present invention.

DESCRIPTION OF THE PREFERRED EMBODIMENT

Figure 1:
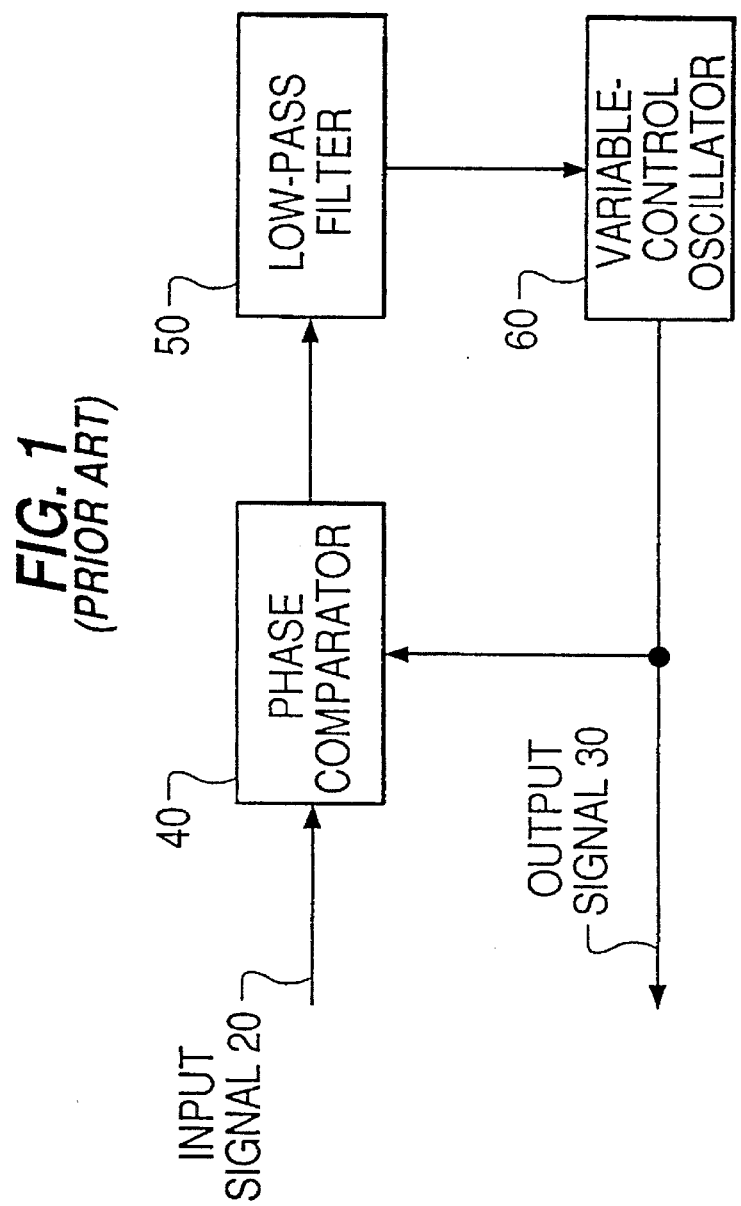
FIG. 1 is a block diagram of a conventional PLL.
Figure 2:
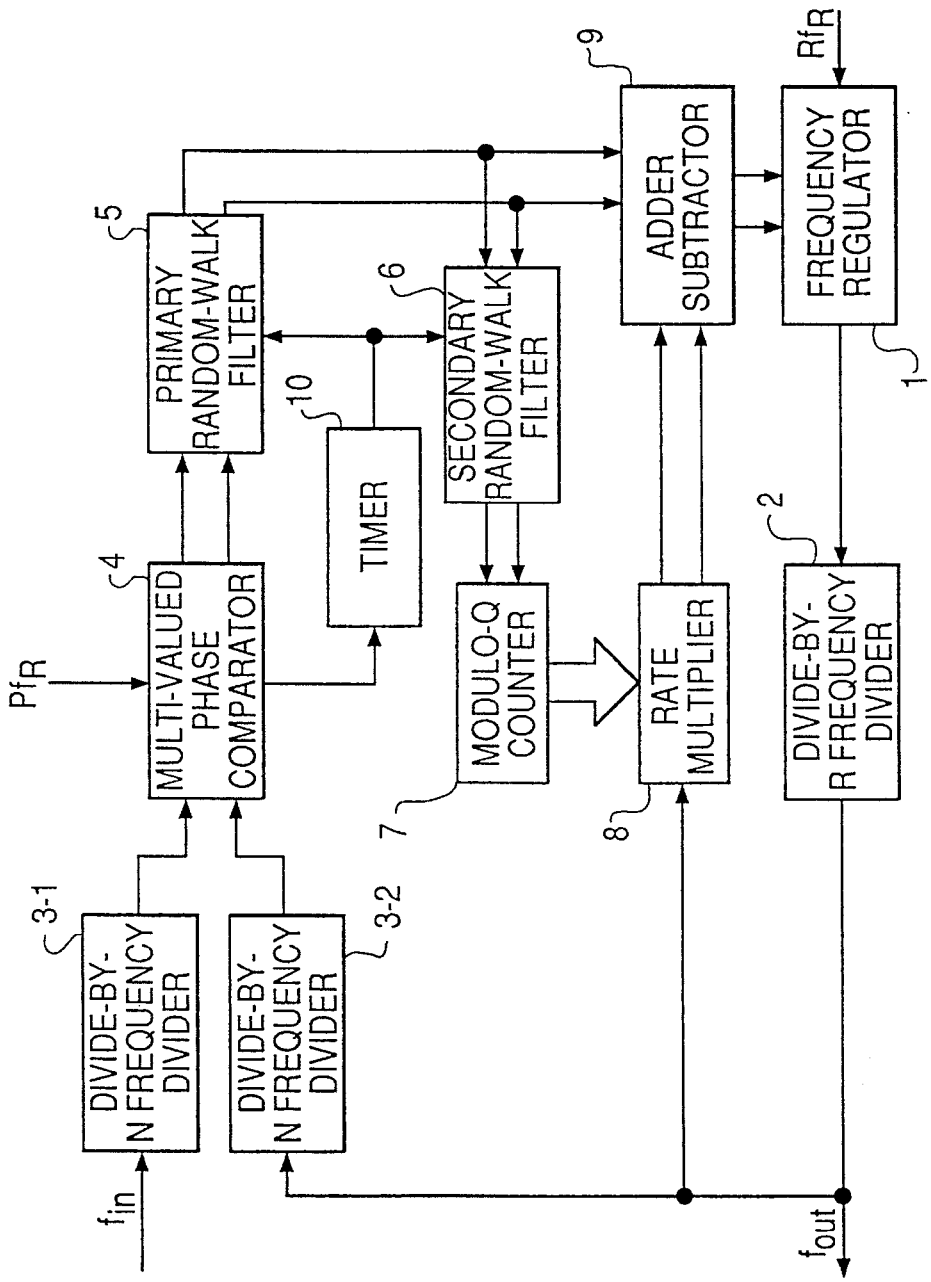
FIG. 2 is a block diagram of a destuffing circuit according to the present invention.

As shown in FIG. 2, a destuffing circuit according to the present invention comprises a frequency regulator 1, a divide-by-R frequency divider 2, a divide-by-N frequency divider 3-1, a divide-by-N frequency divider 3-2, a multi-valued phase comparator 4, a primary random-walk filter 5, a secondary random-walk filter 6, a modulo-Q counter 7, a rate multiplier 8, an adder/subtractor 9, and a timer 10.

The frequency regulator 1, the divide-by-R frequency divider 2, the divide-by-N frequency divider 3-1, the divide-by-N frequency divider 3-2, the multi-valued phase comparator 4, the primary random-walk filter 5, and the adder/subtractor 9 jointly make up a primary loop. The secondary random-walk filter 6, the modulo-Q counter 7, the rate multiplier 8, and the adder/subtractor 9 jointly make up a secondary loop.

The frequency regulator 1 regulates a reference frequency $Rf_R$ by adding or removing pulses. The divide-by-R frequency divider 2 divides the regulated frequency from the frequency regulator 1 by R, producing an output frequency $f_{out}$ of a DPLL. The divide-by-N frequency divider 3-1 divides an input frequency $f_{in}$ by N, and the divide-by-N frequency divider 3-2 divides the output frequency $f_{out}$ by N. The multi-valued phase comparator 4 compares output signals from the divide-by-N frequency dividers 3-1, 3-2 in phase, and counts the phase difference with a frequency $Pf_R$. The primary random-walk filter 5, which is a competition counter, causes the number of leading and lagging pulses outputted from the multi-valued phase comparator 4 to compete with each other, and divides the difference by N1 to produce control pulses to be supplied to the frequency regulator 1. The secondary random-walk filter 6, which is also a competition counter, further divides output signals from the primary random-walk filter 5. Each of the primary and secondary random-walk filters 5, 6 produces two output signals, one for incremental pulses (generated if a lagging phase is detected by the multi-valued phase comparator 4) and one for decremental pulses (generated if a leading phase is detected by the multi-valued phase comparator 4).

The modulo-Q counter 7 stores the output signals from the secondary random-walk filter 6. The rate multiplier 8 has a rate length M. If it is assumed that the modulo-Q counter 7 stores a value "x", then the rate multiplier 8 is controlled to generate control pulses "$f_{out} \times x/M$" with respect to the output frequency $f_{out}$, which is applied as a drive frequency thereto, for thereby producing second additional or removable pulses corresponding to the central frequency of the system for controlling the frequency regulator 1. The adder/subtractor 9 adds and subtracts output signals from the primary and secondary loops to produce final control pulses to be applied to the frequency regulator 1. Specifically, the adder/subtractor 9 adds and subtracts incremental and decremental pulses from the primary random-walk filter 5 and incremental and decremental pulses from the rate multiplier 8. If the output signals from the primary random-walk filter 5 and the rate multiplier 8 are of the same polarity in a certain given period, then the adder/subtractor 9 adds the incremental and decremental pulses. If the output signals from the primary random-walk filter 5 and the rate multiplier 8 are of the opposite polarities in the certain given period, then the adder/subtractor 9 subtracts the incremental and decremental pulses one from the other. Each of the primary and secondary random-walk filters 5, 6 has two time constants, i.e., longer and shorter time constants. Positive and negative thresholds are established in advance in the multi-valued phase comparator 4. If the results of the phase comparison on the output signals from the divide-by-N frequency dividers 3-1, 3-2 exceed the thresholds of the multi-valued phase comparator 4, then the multi-valued phase comparator 4 determines that a phase error generated when an abrupt frequency change occurs exceeds a certain given value, and generates a start signal. In response to the start signal, the primary and secondary random-walk filters 5, 6 are set to the shorter time constants. The timer 10 is started by the start signal from the multi-valued phase comparator 4, and switches the primary and secondary random-walk filters 5, 6 to the longer time constants after elapse of a predetermined period of time.

The divide-by-N frequency dividers 3-1, 3-2 serve as counters for writing and reading received data for energizing a buffer memory which temporarily stores the received data.

Although a certain preferred embodiment of the present invention has been shown and described in detail, it should be understood that various changes and modifications may be made therein without departing from the scope of the appended claims.

What is claimed is:

1. A fully secondary digital phase-locked loop comprising:

a primary loop including frequency regulating means for regulating a reference frequency $Rf_R$ by adding or removing pulses, divide-by-R frequency dividing means for dividing a regulated frequency from said frequency regulating means by R to produce an output frequency $f_{out}$, first and second divide-by-N frequency dividing means for dividing an input frequency $f_{in}$ and said output frequency $f_{out}$ by N, multi-valued phase comparing means for comparing output signals from said first and second divide-by-N frequency dividing means in phase with each other, a primary random-walk filter having longer and shorter time constants, for dividing, by N1, the difference between the numbers of leading and lagging pulses outputted from said multi-valued phase comparing means, and adder/subtracting means for producing control pulses to be supplied to said frequency regulating means;

a secondary loop including a secondary random-walk filter having longer and shorter time constants, for dividing, by N2, an output signal from said primary random-walk filter, a modulo-Q counter for storing an output signal from said secondary random-walk filter, a rate multiplier energizable by said output frequency $f_{out}$ and controllable by the output signal stored by said modulo-Q counter, for generating additional or removable pulses corresponding to a central system frequency, and said adding/subtracting means for adding and subtracting output signals from said primary random-walk filter and said rate multiplier to produce control pulses to be supplied to said frequency regulating means;

phase comparing means for generating a start signal if a phase error generated when an abrupt frequency change occurs exceeds a given value; and timer means for setting said primary random-walk filter and said secondary random-walk filter to the shorter time constants in response to said start signal, and setting said primary random-walk filter and said secondary random-walk filter to the longer time constants after elapse of a predetermined period of time.

2. A fully secondary digital phase-locked loop according to claim 1, wherein said phase comparing means is integral with said multi-valued phase comparing means.

3. A destuffing circuit comprising:

a primary loop including frequency regulating means for regulating a reference frequency $Rf_R$ by adding or removing pulses, divide-by-R frequency dividing means for dividing a regulated frequency from said frequency regulating means by R to produce an output frequency $f_{out}$, first and second divide-by-N frequency dividing means for dividing an input frequency $f_{in}$ and said output frequency $f_{out}$ by N, multi-valued phase comparing means for comparing output signals from said first and second divide-by-N frequency dividing means in phase with each other, a primary random-walk filter having longer and shorter time constants, for dividing, by N1, the difference between the numbers of leading and lagging pulses outputted from said multi-valued phase comparing means, and adder/subtracting means for producing control pulses to be supplied to said frequency regulating means;

a secondary loop including a secondary random-walk filter having longer and shorter time constants, for dividing, by N2, an output signal from said primary random-walk filter, a modulo-Q counter for storing an output signal from said secondary random-walk filter, a rate multiplier energizable by said output frequency $f_{out}$ and controllable by the output signal stored by said modulo-Q counter, for generating additional or removable pulses corresponding to a central system frequency, and said adding/subtracting means for adding and subtracting output signals from said primary random-walk filter and said rate multiplier to produce control pulses to be supplied to said frequency regulating means;

phase comparing means for generating a start signal if a phase error generated when an abrupt frequency change occurs exceeds a given value; and timer means for setting said primary random-walk filter and said secondary random-walk filter to the shorter time constants in response to said start signal, and setting said primary random-walk filter and said secondary random-walk filter to the longer time constants after elapse of a predetermined period of time.

4. A destuffing circuit according to claim 3, wherein said phase comparing means is integral with said multi-valued phase comparing means.

\* \* \* \* \*